United States Patent [19]

Matsuki

[11] Patent Number: 4,589,769
[45] Date of Patent: May 20, 1986

[54] EXPOSURE APPARATUS

[75] Inventor: Toshio Matsuki, Tokyo, Japan

[73] Assignee: Canon Kabushiki Kaisha, Tokyo, Japan

[21] Appl. No.: 640,611

[22] Filed: Aug. 14, 1984

[30] Foreign Application Priority Data

Aug. 23, 1983 [JP] Japan ............... 58-152474

[51] Int. Cl.⁴ ............... G03B 27/72
[52] U.S. Cl. ............... 355/71
[58] Field of Search ............... 355/67, 71

[56] References Cited

U.S. PATENT DOCUMENTS 4,474,463 10/1984 Heimer ............... 355/71

*Primary Examiner*—Richard A. Wintercorn
*Attorney, Agent, or Firm*—Fitzpatrick, Cella, Harper & Scinto

[57] ABSTRACT

An exposure apparatus for exposing a wafer to a circuit pattern formed on a reticle. The exposure apparatus includes a reticle stage for holding the reticle, a wafer stage for holding the wafer, a projection optical system for projecting the image of the circuit pattern onto the wafer, an illumination system for illuminating the reticle, the illumination system having a light source for providing an illumination light beam and optical elements for guiding the illumination light beam along an illumination light path, and a stop disposed in the illumination light path and at a position which is optically conjugate, with respect to the optical elements, with a plane in which the circuit pattern is placed, to intercept a part of the illumination light so that the area of the reticle which is not used for the pattern transfer is shielded from the illumination light without disposing any element in contact with or in the proximity of the reticle.

15 Claims, 8 Drawing Figures

EXPOSURE APPARATUS

BACKGROUND OF THE INVENTION

This invention relates generally to an exposure apparatus for manufacturing semiconductor circuit devices, and more particularly to a projection exposure apparatus having an arrangement for controlling the area of exposure.

Semiconductor devices such as integrated circuits (IC), large scaled integrated circuits (LSI) and very large scaled integrated circuits (VLSI) have been more and more densely integrated and their circuit patterns have been more and more miniaturized. Along these trends, the width of lines in the circuit pattern is required to be very fine to the extent of 1-1.5 microns. To achieve the higher integration of the semiconductor devices and the further miniaturization of the circuit patterns necessitates an exposure apparatus having an exposure performance capable of transferring or printing a fine pattern of the order of 1-1.5 microns line width and an alignment performance capable of precisely aligning the patterns through plural exposure steps with an alignment accuracy which is far higher than the exposure accuracy, while preventing occurrence of defects in the transferred pattern images.

In order to meet these requirements, there has already been developed an exposure apparatus of reduction projection type, called a stepper, wherein the image of an original, such as a reticle or mask, having formed thereon one or more circuit patterns is projected onto a recording member such as a wafer at a reduced scale, the projection exposure being repeated though a step-and-repeat process to reproduce a multiplicity of reticle patterns on the whole surface of the wafer.

While the pattern transfer itself is satisfactory according to the step-and-repeat type projection exposure system, there still remains another problem. The problem is that:

Usually, the region of the surface of the original or reticle other than the circuit pattern region is coated with a film of chromium or other material, by vacuum deposition or the like, in order to prevent the exposure light from being transmitted therethrough. If, however, the coating has defects such as pinholes or the coating is damaged for any reason, the exposure light transmits and leaks through such pinholes or damaged portion. The leaked light will be mixed into the pattern projection light at the current shot of exposure, or will be incident on the wafer area on which the circuit pattern has been projected or is to be projected at the preceding or succeeding shot of exposure. Thus, the leakage of exposure light results in serious defects in the printed circuit patterns and, therefore, is to be prevented.

SUMMARY OF THE INVENTION

It may be considered to use an apertured light-intercepting plate to restrict the exposure or illumination area to prevent or eliminate the above-described leakage of exposure light. This is illustrated in FIGS. 1 and 2 of the attached drawings. The exposure apparatus shown in FIGS. 1 or 2 is of the reduction projection type and includes a stage 3 for holding a reticle 2 on which a circuit pattern 2a is formed. The apparatus further includes a projection lens 4 for projecting the circuit pattern 2a of the reticle 2 onto a wafer 5.

In FIG. 1, the light-intercepting plate is designated by a reference numeral 1 and is disposed above the reticle 2 in order to prevent the exposure light from being incident on the surface area of the reticle 2 other than the circuit pattern 2a area. It is necessary that the light-intercepting plate 1 is spaced through a distance a from the reticle 2 to prevent the damage of the circuit pattern 2a thereon.

In FIG. 2, on the other hand, the light-intercepting plate also designated at 1 is disposed below the reticle 2 to block any exposure light transmitted through the area of the reticle 2 other than the circuit pattern 2a area. The light-intercepting plate of FIG. 2 also is spaced through a distance b from the reticle 2 to prevent the damage of the circuit pattern 2a.

With these arrangements, however, prevention of the above-described leakage of the exposure light is not satisfactory.

That is, in the FIG. 1 arrangement, the exposure light supplied from an unshown illumination source is generally convergent and, therefore, the aperture-defining edge designated at 1a of the light-intercepting plate 1 has to be located radially outwardly of the outer periphery of the circuit pattern 2a area by a distance c in order to prevent any aperture eclipse or shading of the exposure light at the peripheral part of the circuit pattern 2a area. Actually, however, a part of the light rays emitted from the illumination source goes behind the aperture-defining edge 1a portion and can reach the area of the reticle 2 other than the circuit pattern 2a area to illuminate it. Also in FIG. 2 arrangement, the light-intercepting plate 1 is spaced away from the reticle 2 and, moreover, the aperture-defining edge 1a thereof has to be located radially outwardly of the circuit pattern 2a area of the reticle 2 by a distance d to prevent any eclipse or shading of the exposure light entering into the projection lens 4. Therefore, any rays which have been transmitted through the area of the reticle 2 other than the circuit pattern 2a area could not be blocked effectively.

It is accordingly a primary object of the present invention to provide an exposure apparatus which is free from the above-described problem and in which the illumination area is controlled or regulated at a position precisely coincident with or corresponding to the surface on which a pattern to be transferred is formed, to ensure accurate illumination of the pattern area.

A second object of the present invention is to provide an exposure apparatus having light-intercepting means which is effective to block the passage of exposure light through any pinholes formed in the peripheral area of a reticle or mask around a circuit pattern area thereof.

A third object of the present invention is to provide an exposure apparatus capable of defining an illumination area which is variable in accordance with the dimensions of the region to be exposed.

A fourth object of the present invention is to provide an exposure apparatus capable of defining an illumination area in accordance with any irregular shape of the region to be exposed.

A fifth object of the present invention is to provide an exposure apparatus for use with a reticle or mask having a circuit pattern and a test pattern formed thereon, the apparatus being effective to block only the exposure of the test pattern as required.

A sixth object of the present invention is to provide an exposure apparatus wherein the area to be exposed is accurately illuminated even if a reticle or wafer set in its place contains rotational deviation.

A seventh object of the present invention is to provide an exposure apparatus which ensures accurate illumination of the region to be exposed, for various reticles or masks of different thickness.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
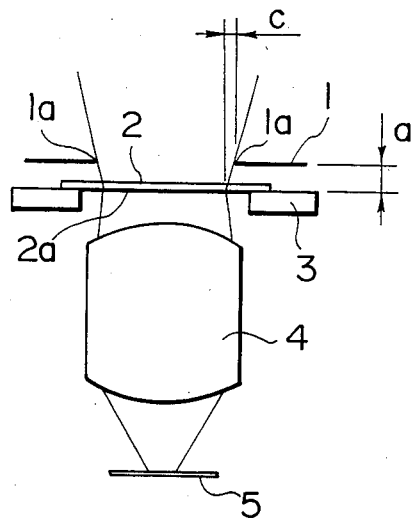
FIGS. 1 and 2 are views showing examples of optical arrangements of exposure apparaturses having light-intercepting means.

The invention will now be described with reference to the embodiments thereof illustrated in the drawings.

Figure 2:
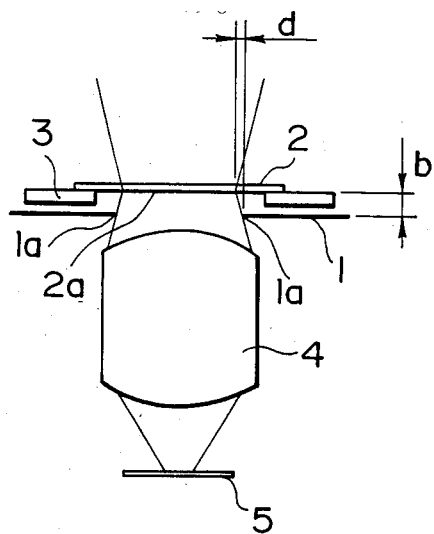
Figure 3:
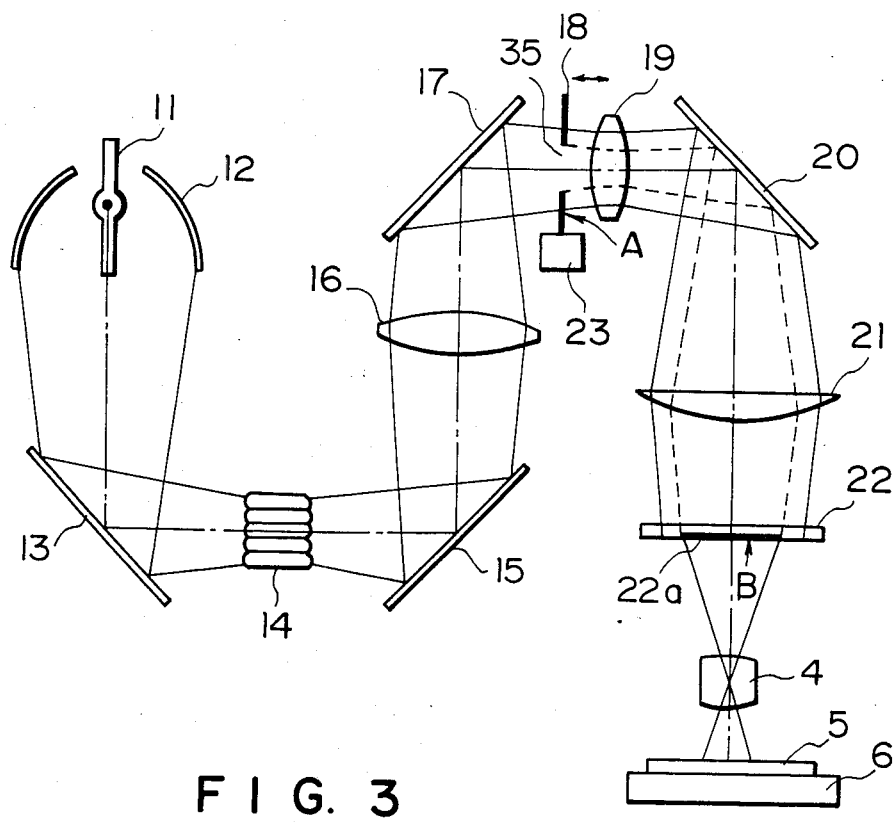
FIG. 3 is a view showing an optical arrangement of an exposure apparatus according to an embodiment of the present invention.

Referring to FIG. 3, there is shown an exposure apparatus of the reduction projection type, called a stepper, which includes a radiation energy applying system such as an illumination system for applying a radiation energy to an original such as a reticle 22 having on its lower surface a circuit pattern 22a. Although it is not clearly shown in this Figure, the reticle 22 is held by a reticle holder similar to that shown in FIGS. 1 or 2. A reduction projection lens 4 is disposed below the reticle 22 to project the circuit pattern 22a of the reticle 22 onto a radiation-sensitive recording member such as a wafer 5. The wafer 5 is held by a stage 6 which is arranged for step-and-repeat movement.

The illumination system includes a light source 11 such as an extra-high-voltage mercury lamp and an ellipsoidal mirror 12 disposed adjacent to the light source 11 to effectively collect the light rays emitted from the light source. The apparatus further includes, in the order along the optical path, a cold mirror 13 for transmitting therethrough most of the infrared-rays and reflecting the ultraviolet-rays; an integrater 14 for rendering uniform the distribution characteristic of the light beam; a reflector 15; a condenser lens 16; another reflector 17; a light-intercepting device 18; another condenser lens 19; another reflector 20; and a collimating lens 21. The reflectors 15, 17 and 20 are provided to deflect orthogonally the optical axis to make the illumination system compact. The condenser lens 16 is disposed to converge the light beam from the light source 11 to supply uniform illumination light to the light-intercepting device 18 which will be described in more detail with reference to FIG. 6.

Figures 4, 5:
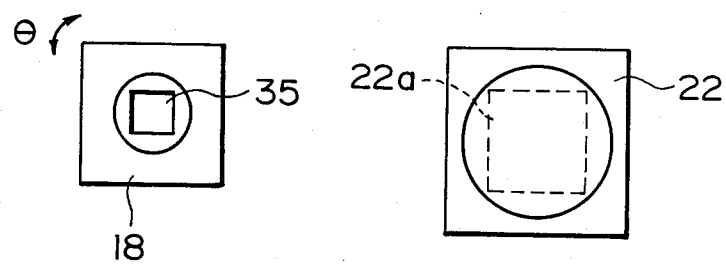
FIG. 4 is a schematic plan view showing the light-intercepting means shown in FIG. 3.
FIG. 5 is a plan view showing the reticle shown in FIG. 3.
Figure 6:
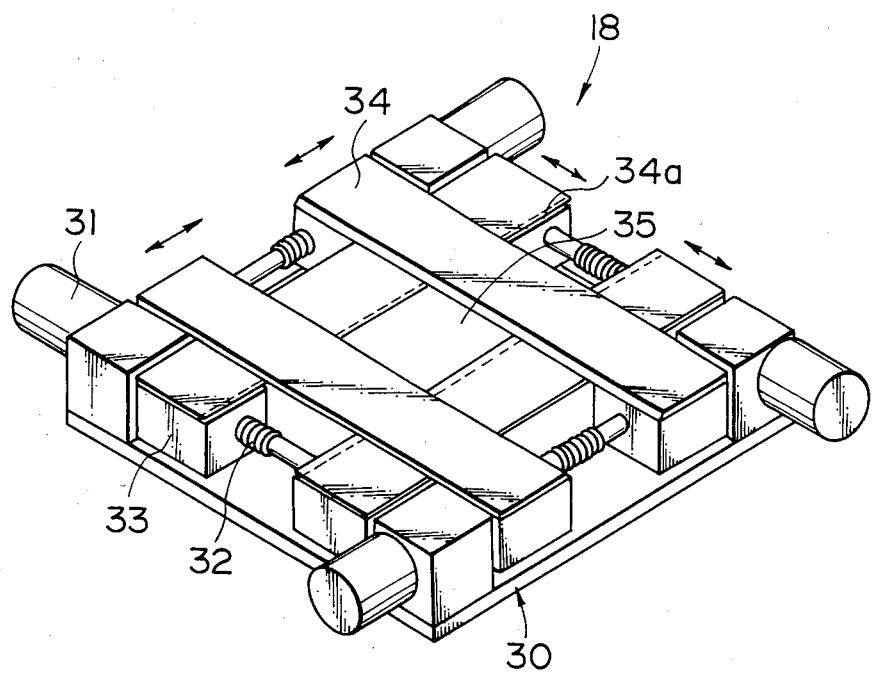
FIG. 6 is a perspective view showing the light-intercepting means shown in FIG. 3.

FIG. 6 is a perspective view showing the light-intercepting device 18 according to one embodiment of the present invention. The light-intercepting device 18, as is best shown in FIG. 3, is disposed so that the intercepting surface A is optically conjugate with the pattern surface B of the reticle 22 with respect to the lenses 19 and 21. For the purpose of achieving alignment in respect to the rotational direction with the wafer 5 disposed below the reticle 22, the light-intercepting device 18 is adapted to be rotated in the directions as denoted by a double-headed arrow $\theta$ in FIG. 4, with the rotation of the reticle 22, by means of a driving mechanism 23. The light-intercepting device 18 is also arranged to be moved along the optical axis by the driving mechanism. With this arrangement, a precise conjugate relation can be maintained between the intercepting surface A of the light-intercepting device 18 and the pattern surface of the reticle, even if the reticle is replaced by another having a transparent glass portion of different thickness providing a different refracting power.

Turning now to FIG. 6, the light-intercepting device 18 comprises a base plate 30 on which there are provided four sets of motors 31, feed screws 32, nut elements 33 and light-intercepting plates 34. Each of the screws 32 is fixed to an associated one of the motors 31 to be rotatively driven thereby. Each nut element 33 is movable in one direction by means of a corresponding one of the motors 31 through the rotation of a corresponding one of the screws 32. Each of the light-intercepting plates 34 has a keen knife edge portion 34a and is fixed on an associated one of the nut elements 33. The edge portions 34a of the four light-intercepting plates 34 cooperate to define a rectangular window or aperture 35. Thus, the plane including the aperture 35 defines the light-interception plane A of the light-intercepting device 18 as shown in FIG. 3.

With this arrangement of the exposure apparatus, the light beam emitted from the light source 11 is reflected and refracted by the optical elements 12–17 and uniformly illuminates the light-intercepting device 18. A part of the light beam incident on the light-intercepting device 18 is intercepted by the four light-intercepting plates 34, and the light beam passing through the aperture 35 illuminates the pattern surface B of the reticle 22 such as shown in FIG. 3. Since the light-interception plane A of the light-intercepting device 18 and the pattern surface B of the reticle 22 are in the optically conjugate relation with each other, the edge of the rectangular aperture 35 of the light-intercepting device 18 is clearly and sharply projected or imaged on the pattern surface B, such as designated by the broken line in FIG. 5, so that the area of the reticle 22 other than the circuit pattern area 22a is perfectly shielded from the illumination light.

As has been described in the foregoing, the light-intercepting device 18 is rotatable in the directions $\theta$ (FIG. 4) for the purpose of alignment in respect to the rotational direction with the circuit pattern 22a of the reticle 22, and is also movable in the direction of the optical axis (FIG. 3) in order to maintain the optically conjugate relation as aforesaid when the reticle is replaced by one having a different thickness, i.e., a different refracting power. Moreover, the region and position of the aperture 35 of the light-intercepting device 18 can be changed in the direction orthogonal to the optical axis by moving one or more of the light-intercepting plates 34. The movement of each the light-intercepting plates 34 can be independently achieved by the rotation of an associated one of the motors 31, the rotation of a corresponding one of the feed screws 32 connected to the shaft of the motor 31 and the one-direction movement of a corresponding one of the nut elements 33, in response to a signal supplied from an electronic processing unit (not shown) of the exposure apparatus in accordace with the size of the reticle. In this manner, the movement and adjustment of the four light-intercepting plates 34 can be performed independently but simultaneously to ensure illumination of the reticle 22, with the illumination area being precisely registered with the region of the circuit pattern 22a area of the reticle 22.

In accordance with the present invention, therefore, the size, shape and position of the illumination area or light-interception area on the reticle can be infinitely adjusted within the range of an effective illumination area of the illumination system on the basis of signals supplied from the electronic processing unit.

Figure 7A:
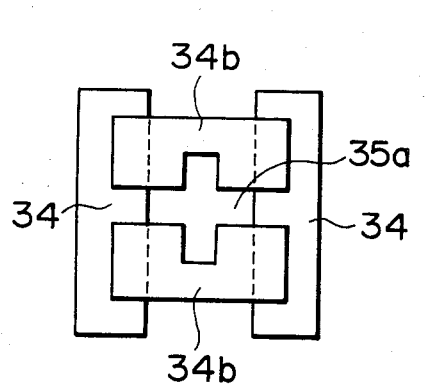
FIGS. 7A and 7B are schematic plan views showing modified forms of the light-intercepting means.
Figure 7B:
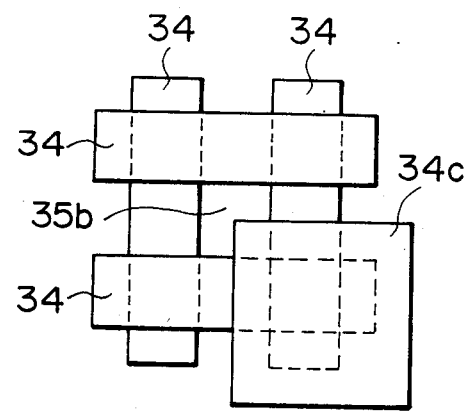

Further, in accordance with another aspect of the present invention, a reticle having a circuit pattern area of irregular or non-rectangular shape can be correctly illuminated. Examples are shown in FIGS. 7A and 7B. In FIG. 7A, two light-intercepting plates 34b having rectangularly notched portions are used in place of two of the four light-intercepting plates 34 of the light-intercepting device 18, to define a light transmitting aperture 35b. In FIG. 7B, on the other hand, an additional light-intercepting plate 34c is used with the four light-intercepting plates 34 to define an aperture also denoted at 35b. In these manners, the circuit pattern areas of various shapes can be correctly illuminated.

It will be easily understood that the present invention in a further aspect thereof permits selective exposure for a reticle having a circuit pattern and a test pattern. More specifically, the circuit pattern can be selectively exposed while shielding the test pattern from the exposure light in the manner as has been described in the foregoing, and, on the other hand, the test pattern can be exposed while the circuit pattern is shielding from the exposure light.

According to the present invention, as has hitherto been described, light-intercepting means having a keen knife edge is disposed in a plane which is optically conjugate with the pattern surface of a reticle, whereby the edge of the light-intercepting means is very sharply imaged on the pattern surface of the reticle through a lens system. As the result, the area of the reticle other than the pattern area can be effectively and perfectly shielded from the exposure light.

While the invention has been described with reference to the structures disclosed herein, it is not confined to the details set forth and this application is intended to cover such modifications or changes as may come within the purposes of the improvements or the scope of the following claims. For example, the present invention is not restricted to an exposure apparatus of the reduction projection type as in the disclosed embodiment, and it will be apparent to those skilled in the art that the invention is applicable to any exposure apparatus of the contact exposure type, proximity exposure type or one-to-one magnification projection exposure type.

What is claimed is:

1. An exposure apparatus for exposing a wafer to light passed through a reticle having a circuit pattern formed thereon, said apparatus comprising:
    a light source for supplying light to irradiate the reticle with the light; and
    light-intercepting means disposed between said light source and the reticle, for at least partially intercepting the light supplied from said light source, said light-intercepting means having a first pair of light-blocking plates to oblong shape and a second pair of light-blocking plates of oblong shape, said first and second pairs of light-blocking plates being cooperative with each other and being movable independently from each other to define an aperture of variable shape for allowing passage of at least a portion of the light supplied from said light source, each of said light-blocking plates of said first and second pairs having a side edge effective to define a portion of said aperture;
    said first pair of light-blocking plates being disposed on said second pair of light-blocking plates so that the side edges of said light-blocking plates of said first and second pairs, defining said aperture, are located substantially in the same plane.

2. An apparatus according to claim 1, wherein each of the edges of said first and second pairs of light-blocking plates, defining a portion of said aperture, has a knife edge shape.

3. An apparatus according to claim 1, wherein said first and second pairs of light-blocking plates are movably supported by a common support member.

4. An apparatus according to claim 1, further comprising: driving motors associated respectively with said light-blocking plates of said first and second pairs, each of said driving motors supplying a drive to move an associated one of said light-blocking plates of said first and second pairs; and plural shaft means operationally connected to said driving motors, respectively, and being engaged respectively with said light-blocking plates of said first and second pairs of transmit the drives of said driving motors to said light-blocking plates of said first and second pairs, respectively.

5. An apparatus according to claim 1, wherein said light-intercepting means is movable in a rotational direction in accordance with rotational displacement of the reticle.

6. An apparatus according to claim 1, wherein said light-intercepting means is movable in the direction of a path of the light between said light source and the reticle, in accordance with the thickness of the reticle.

7. An exposure apparatus for exposing a wafer to light passed through a reticle having a circuit pattern formed thereon, said apparatus comprising:
    a light source for supplying light to irradiate the reticle; and
    light-intercepting means disposed between said light source and the reticle and at a position optically conjugate with a plane in which the circuit pattern of the reticle is placed, for at least partially intercepting the light supplied from said light source;
    said light-intercepting means being capable of defining therein an aperture, allowing passage of the light supplied from said light source, having an area corresponding to the circuit pattern of the reticle;
    and said light-intercepting means being movable in a rotational direction in accordance with rotational displacement of the reticle.

8. An apparatus according to claim 7, wherein said light-intercepting means has at least one pair of movable light-blocking plates of oblong shape.

9. An apparatus according to claim 7, wherein said light-intercepting means has two pairs of movable light-blocking plates to oblong shape.

10. An exposure apparatus for exposing a wafer to light passed through a reticle having a circuit pattern formed thereon, said apparatus comprising:
    a light source for supplying light to irradiate the reticle with the light; and light-intercepting means disposed between said light source and the reticle and at a position optically conjugate with a plane in which the circuit pattern of the reticle is placed, for at least partially intercepting the light supplied from said light source;

said light-intercepting means being capable fo defining therein an aperture, allowing passage of the light supplied from said light source, having an area corresponding to the circuit pattern of the reticle;

and said light-intercepting means being movable in the direction of a path of the light between said light source and the reticle, in accordance with the thickness of the reticle.

11. An apparatus according to claim 10, wherein said light-intercepting means has at least one pair of movable light-blocking plates of oblong shape.

12. An apparatus according to claim 10, wherein said light-intercepting means has two pairs of movable light-blocking plates of oblong shape.

13. An exposure apparatus for exposing a wafer to light passed through a reticle having a circuit pattern formed thereon, said apparatus comprising:

a light source for supplying light to irradiate the reticle; and light-intercepting means disposed between said light source and the reticle, for at least partially intercepting the light supplied from said light source, said light-intercepting means having plural light-blocking plates of oblong shape cooperative with each other to define a rectangular aperture of variable area for allowing passage of the light supplied from said light source;

wherein each side of said rectangular aperture is defined by only one side edge of one of said light-blocking plates.

14. An apparatus according to claim 13, wherein the side edge of each of said light-blocking plates, defining corresponding one of the sides of said rectangular aperture, has a knife edge shape.

15. An apparatus according to claim 13, wherein said light-intercepting means has four light-blocking plates.

* * * * *

UNITED STATES PATENT AND TRADEMARK OFFICE
CERTIFICATE OF CORRECTION

PATENT NO. : 4,589,769

DATED : May 20, 1986

INVENTOR(S) : Toshio Matsuki

It is certified that error appears in the above-identified patent and that said Letters Patent is hereby corrected as shown below:

Column 1, line 11, change "large scaled" to --large-scale--; and
line 12, change "large scaled" to --large-scale--.

Column 3, line 13, change "apparaturses" to --apparatuses--; and
line 51, change "integrater" to --integrator--.

Column 4, line 24, change "knife edge" to --knife-edge--;

Column 4-5, lines 68 to line 1, change "accordace" to --accordance--;

Column 5, line 20, change "lighttransmitting" to --light-transmitting--;
line 33, change "shielding" to --shielded--; and
line 37, change "knife edge" to --knife-edge--;
line 67, change "to" to --of--.

UNITED STATES PATENT AND TRADEMARK OFFICE
CERTIFICATE OF CORRECTION

PATENT NO. : 4,589,769

DATED : May 20, 1986

INVENTOR(S) : Toshio Matsuki

It is certified that error appears in the above-identified patent and that said Letters Patent is hereby corrected as shown below:

Column 6, lines 16-17, change "knife edge" to --knife-edge--;

line 29, change "pairs of transmit" to --pairs to transmit--; and line 63, change "to" to --of--.

Column 7, line 6, change "fo" to --of--.

Column 8, line 20, change "knife edge" to --knife-edge--.

Signed and Sealed this

Sixth Day of January, 1987

Attest:

DONALD J. QUIGG

Attesting Officer

Commissioner of Patents and Trademarks